US012712565B2

(12) United States Patent
McLachlan et al.

(10) Patent No.: US 12,712,565 B2
(45) Date of Patent: Aug. 18, 2026

(54) DIGITAL-TO-ANALOG CONVERTER

(71) Applicant: Analog Devices International Unlimited Company, County Limerick (IE)

(72) Inventors: Roderick McLachlan, Edinburgh (GB); Ken Bryan Fabay, Binangonan (PH); Sharad Vijaykumar, Mysore (IN)

(73) Assignee: Analog Devices International Unlimited Company, County Limerick (IE)

( * ) Notice: Subject to any disclaimer, the term of this patent is extended or adjusted under 35 U.S.C. 154(b) by 86 days.

(21) Appl. No.: 18/679,005

(22) Filed: May 30, 2024

(65) Prior Publication Data

US 2025/0070793 A1 Feb. 27, 2025

Related U.S. Application Data

(60) Provisional application No. 63/578,944, filed on Aug. 25, 2023.

(51) Int. Cl.
*H03M 1/68* (2006.01)

(52) U.S. Cl.
CPC .................................. *H03M 1/687* (2013.01)

(58) Field of Classification Search
CPC .. H03M 1/687; H03M 1/0602; H03M 1/0617; H03M 1/682; H03M 1/742
See application file for complete search history.

(56) References Cited

U.S. PATENT DOCUMENTS 5,294,927 A * 3/1994 Levinson .............. H03M 1/682 341/145
5,396,245 A * 3/1995 Rempfer ............. H03M 1/0602 341/145
5,859,606 A 1/1999 Schrader et al.
5,870,049 A * 2/1999 Huang .................... H03M 1/68 341/144
6,037,888 A * 3/2000 Nairn .................... H03M 1/687 341/145

(Continued)

FOREIGN PATENT DOCUMENTS

EP 0607971 A2 7/1994
WO WO 2017/144605 A1 8/2017

OTHER PUBLICATIONS

Schoeff, J.A., "An Inherently Monotonic 12 Bit DAC", IEEE Journal of Solid-State Circuits, Dec. 1979, vol. SC-14, No. 6, pp. 904-911.

(Continued)

*Primary Examiner* — Lam T Mai
(74) *Attorney, Agent, or Firm* — Knobbe, Martens, Olson & Bear, LLP

(57) ABSTRACT

There is provided a method for controlling a digital-to-analog converter, DAC. The DAC receives a digital input comprising a plurality of bits including a first segment comprising X most significant bits, MSBs, and a second segment comprising Y least significant bits, LSBs. The DAC modifies the connection of a plurality of current sources, changing the current source coupling between LSB and MSB transconductance stages. By doing this, the monotonicity of the system can be improved in a compact DAC.

20 Claims, 10 Drawing Sheets

(56) References Cited

U.S. PATENT DOCUMENTS 6,118,398 A * 9/2000 Fisher ................. H03M 1/0653 341/119
6,246,351 B1 * 6/2001 Yilmaz ............... H03M 1/0682 341/145
6,650,265 B1 * 11/2003 Bugeja .................. H03M 1/002 341/145
7,161,517 B1 * 1/2007 Yen ......................... H03M 1/68 341/145
7,242,726 B2 * 7/2007 Cameron ............ H03M 13/258 714/701
7,456,773 B1 * 11/2008 Seo ....................... H03M 1/002 341/145
7,535,397 B1 * 5/2009 Chiou ..................... H03M 1/68 341/145
7,978,110 B2 * 7/2011 Lai ...................... H03M 1/1061 341/145
9,258,010 B1 * 2/2016 Lakshmikumar ....... H03M 1/68
9,503,113 B1 * 11/2016 Thomsen ............ H03M 1/0609
9,941,897 B1 * 4/2018 Li ......................... H03M 1/201
9,991,900 B1 * 6/2018 Kabir .................. H03M 1/0673
10,069,505 B1 * 9/2018 Poulton ............... H03M 1/0641
10,075,179 B1 * 9/2018 Keane ..................... H03M 1/70
10,305,505 B1 * 5/2019 Zhang ..................... H03M 1/68
11,811,420 B2 * 11/2023 Yilmaz ................... H03M 1/68
2003/0001765 A1 * 1/2003 Bright ................. H03M 1/0604 341/145
2003/0117307 A1 * 6/2003 Deak ..................... H03M 1/682 341/145
2004/0240590 A1 * 12/2004 Cameron ................ H04L 1/005 375/340
2007/0001883 A1 * 1/2007 Yen ......................... H03M 1/68 341/144
2007/0001885 A1 * 1/2007 Yen ......................... H03M 1/68 341/144
2008/0136695 A1 * 6/2008 Marais ................ H03M 1/0604 341/144
2010/0109924 A1 * 5/2010 Cho .................... H03M 1/0695 341/118
2010/0283642 A1 * 11/2010 Lai ...................... H03M 1/1061 341/120
2011/0037630 A1 * 2/2011 McLachlan ......... H03M 1/1019 341/120
2023/0238980 A1 * 7/2023 Yilmaz ................... H03M 1/68 341/144

OTHER PUBLICATIONS

Schouwenaars, H.J., et al., "A Low-Power Stereo 16-bit CMOS D/A Converter for Digital Audio", IEEE Journal of Solid-State Circuits, Dec. 1988, vol. 23, No. 6, pp. 1290-1297.

* cited by examiner 310
308
312
320
502
318
316
314
332
330
328
326
324
322
306
302
304
512
510
508
504
506
500
V1
V2
V1
V2

DIGITAL-TO-ANALOG CONVERTER

CROSS REFERENCE TO PRIORITY APPLICATION

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/578,944, filed Aug. 25, 2023 and titled "DIGITAL TO ANALOG CONVERTER," the disclosure of which is hereby incorporated by reference in its entirety and for all purposes.

TECHNICAL FIELD

The present disclosure relates to a method for controlling a digital-to-analog converter, and a digital-to-analog converter.

BACKGROUND

Digital-to-analog converters, DACs, receive a digital input, code or word and generate an analog output signal. A segmented DAC may comprise multiple sections or DACs, each configured to convert a different part of the digital input. These parts may then be combined to provide the analog output of the DAC.

The digital input comprises one or more most significant bits (MSBs) and one or more least significant bits (LSBs). A segmented DAC may therefore comprise one or more most significant bit sections, acting to convert the MSBs of the digital input, and one or more least significant bit sections, acting to convert the one or more LSBs. The outputs of the MSB and LSB sections are then combined to provide the analog.

A segmented DAC may be based on one of a number of different DAC technologies, such as ladder DACs or string DACs. Based on how the MSB and LSB sections of the DAC are segmented, the size of the decoders and number of switches required may change. Further, segmentation of the DAC can impact the linearity and monotonicity of the system.

It is desirable to provide a DAC comprising a limited number of switches that has improved monotonicity.

SUMMARY

There is provided a method for controlling a digital-to-analog converter, DAC. In the method, the following steps are performed: receiving a digital input; detecting a change in the value of the most significant bits of the digital input; decoupling a first current source from a first transconductance stage; and coupling the first current source to a second transconductance stage.

According to a first aspect of the disclosure, there is provided a method for controlling a digital-to-analog converter, DAC, the method comprising: receiving a digital input comprising a plurality of bits including a first segment comprising X most significant bits, MSBs, and a second segment comprising Y least significant bits, LSBs; detecting a change in the value of the MSBs and detecting a change in the value of the LSBs by $2^Y-1$; decoupling a first current source from a least-significant bit, LSB, transconductance stage of the DAC; and coupling the first current source to a first most-significant bit, MSB, transconductance stage of the decoder.

According to a second aspect of the disclosure, there is provided a digital-to-analog converter, DAC, circuit comprising: an input for receiving a digital input comprising a plurality of bits including a first segment comprising X most significant bits, MSBs, and a second segment comprising Y least significant bits, LSBs; an LSB transconductance stage; one or more MSB transconductance stages comprising a first transconductance stage; a first current source; a switching circuit, the switching circuit coupled between the first current source and the LSB transconductance stage and the one or more MSB transconductance stages, wherein, when the value of the MSBs change and the value of the LSBs change by $2^Y-1$, the switching circuit is configured to: decouple the first current source from the LSB transconductance stage and couple the first current source to the first MSB transconductance stage.

According to a third aspect of the disclosure, there is provided a method for controlling a digital-to-analog converter, DAC, the method comprising: receiving a digital input; detecting a change in the value of the most significant bits, MSBs, of the digital input and detecting a change in the value of the least significant bits, LSBs, of the digital input by $2^Y-1$; decoupling a first current source from a first transconductance stage of the DAC; and coupling the first current source to a second transconductance stage of the decoder.

DETAILED DESCRIPTION

Segmented DACs comprise one or more most significant bit sections, acting to convert the MSBs of the digital input, and one or more least significant bit sections, acting to convert the one or more LSBs of the digital input. Based on how the MSB and LSB sections of the DAC are segmented, the size of the decoders and number of switches required may change.

A segmented DAC may comprise a thermometric LSB stage. Thermometric DACs guarantee monotonicity of the analog output. A fully monotonic DAC has an output that changes in the same direction as the input (e.g. when the input increases, the output of the DAC increases). The output of a non-monotonic DAC may change in the opposite way to the input (e.g. when the input increases, the output of the DAC decreases). It is desirable to provide DACs that are monotonic. However, typically, thermometric DACs require a large number of switches, taking up a large area. Further, the large number of switches increase other errors due to leakage. This limits the practical uses of thermometric segmented DACs, as a large DAC is required to provide a highly monotonic output.

It is desirable to provide a DAC comprising a limited number of switches that has improved monotonicity.

A DAC may include differential pair devices, with the sources of the differential pairs coupled to a current source. Changing the control signals that supply the gate voltages of the differential pairs results in a different current being drawn, providing an analog output that is related to the digital input. To improve device linearity, a number of current sources may be used, with a separate current source coupled to each differential pair. To provide a linear system, closely-matched input-differential pair devices and current sources are used. However, the greater the degree of matching between the current sources, the greater the area required to provide the current sources.

So as to provide a monotonic DAC in a small area, a switching circuit may be used to modify the coupling of the current sources. During a transition in the DAC input, a current source may be decoupled from a first transconductance stage providing an LSB portion of the DAC output and coupled to a second transconductance stage providing an MSB portion of the DAC output. This ensures that the same current source error is provided to the MSB transconductance stage as was provided to the LSB transconductance stage. Maintaining a consistent error during the transition of the DAC input ensures that the output transitions monotonically. This enables a compact DAC with a limited number of switches and monotonic output.

Figure 1:
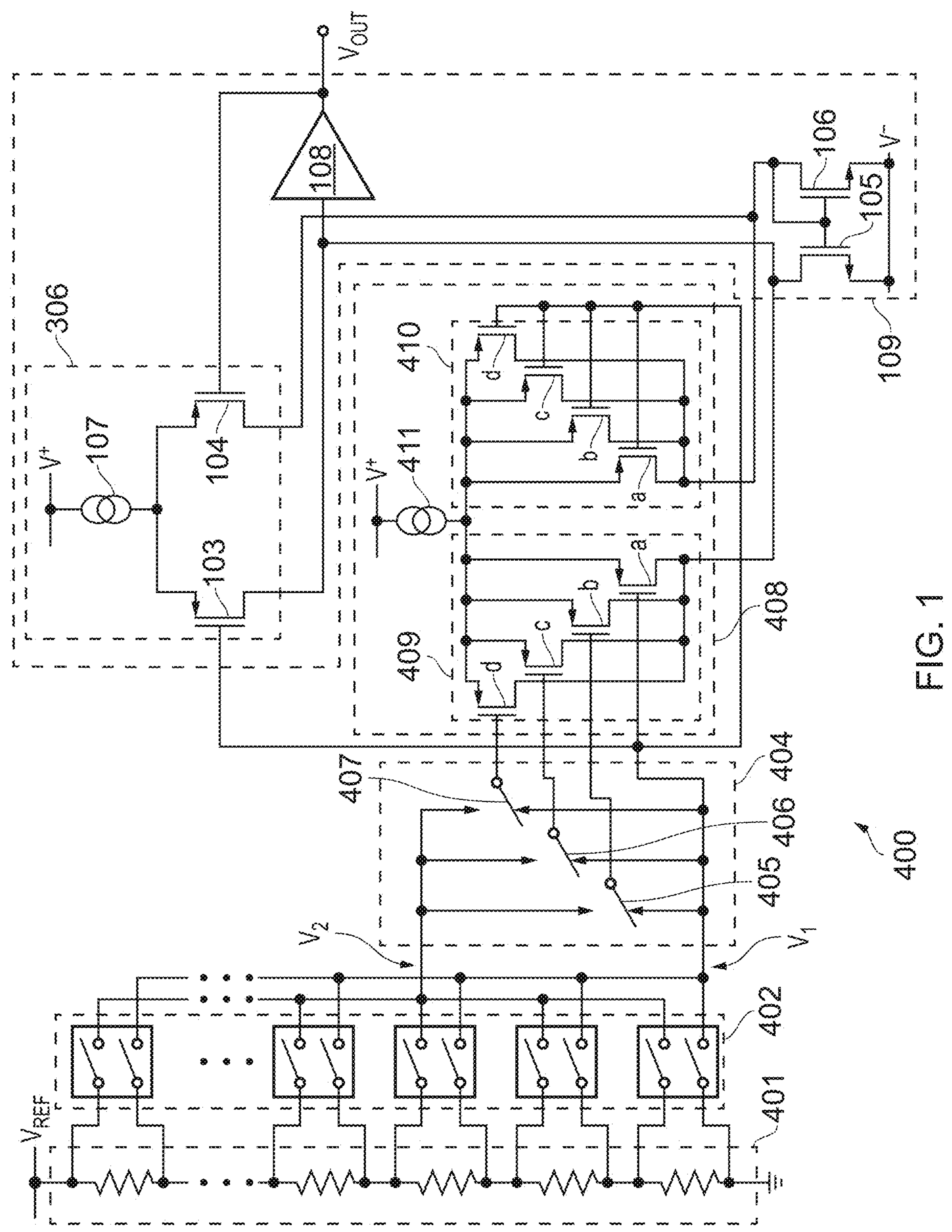
FIG. 1 is a schematic diagram of a segmented DAC.

FIG. 1 is a schematic diagram of a DAC 400 comprising a resistor string or resistive device bank 401. The DAC 400 receives a digital input and generates an analog output. A switching device bank 402 comprises a plurality of switches coupled to the resistor string 401. The switches of the switching device bank 402 are controlled by the most significant bits (MSBs) of a digital input, with a particular two switches of the switching device bank 402 closed in dependence on the value of the MSBs. As such, the switching device bank 402 may be considered to be an MSB section of the DAC 400.

The MSB section 402 outputs two reference voltages (V1 and V2). The values of the voltages V1 and V2 are dependent on which switches of the MSB section 402 are closed, and therefore representative of the MSBs of the digital input word.

The voltages V1 and V2 are provided to a second switching device bank 404 comprising a plurality of switches 405, 406, 407. The switches of the second switching device bank 404 are controlled in dependence on the value of the least significant bits (LSBs) of the digital input word. As such, the second switching device bank 404 may be considered to be an LSB section of the DAC 400.

The plurality of switches of the LSB section 404 of the DAC 400 couple the voltages V1 and V2 from the MSB section 402 of the DAC to a transconductance stage 408. The transconductance stage 408 receives a plurality of output voltages from the LSB section 404 of the DAC and provides a proportional output current. The output voltages of the LSB section 404 are coupled to the gates of a plurality of transistors 409*a*-409*d*, which form part of transistor differential pair devices, of the transconductance stage 408. As such, the gates of the differential pairs are coupled to either V1 or V2, depending on the value of the LSBs. The sources of each of the plurality of transistors 409*a*-409*d* are coupled to a current source 411.

If the value of all the LSBs of the digital input are 0, then the switches 405-407 are all coupled to the voltage V1. This couples the voltage V1 to the gates of the plurality of transistors 409*a*-409*d*. If the value of all the LSBs of the digital input are 1, then the switches 405-407 are all coupled to the voltage V2. This couples the voltage V2 to the gates of the plurality of transistors 409*b*-409*d*. Changing the gate voltages of the plurality of transistors 409 results in a current being drawn from the current source 411 that is proportional to the number of transistors that are coupled to each of the voltages V1 and V2. This changes an output voltage of the DAC.

As such, the DAC 400 acts to provide an analog output based on the digital input.

The source terminals of the transistors of the transconductance stage 408 are coupled to a single current source 411. However, this introduces a non-linearity as the LSB code changes.

The DAC 400 shown in FIG. 1 comprises an MSB section 401/402 and an LSB section 404. The transconductance stage of the DAC 400 comprises a plurality of differential transistor pairs Q1, Q2, Q3. As noted, all of the differential transistor pairs are coupled to the same current source. each transistor pair may instead be coupled to a respective, dedicated, current source.

Providing a plurality of current sources, such that each differential pair of the transconductance stage 408 is coupled to a separate, dedicated, current source substantially improves the linearity of the DAC 400.

The LSB decoder of the DAC 400 of FIG. 1 is thermometric, which guarantees that the DAC is monotonic. However, the DAC 400 of FIG. 1 requires a large number of switches due to how the DACs are segmented. For example, where the DAC is an 8-bit DAC, 256 switches are used in the MSB section and the LSB section. There is a need to reduce the number of switches in the DAC to reduce the total DAC size, whilst maintaining high monotonicity.

The DAC 400 of FIG. 1 includes two stages. The first stage outputs two reference voltages V1 and V2. The second stage receives these reference voltages and provides an analog output.

Figure 2A:
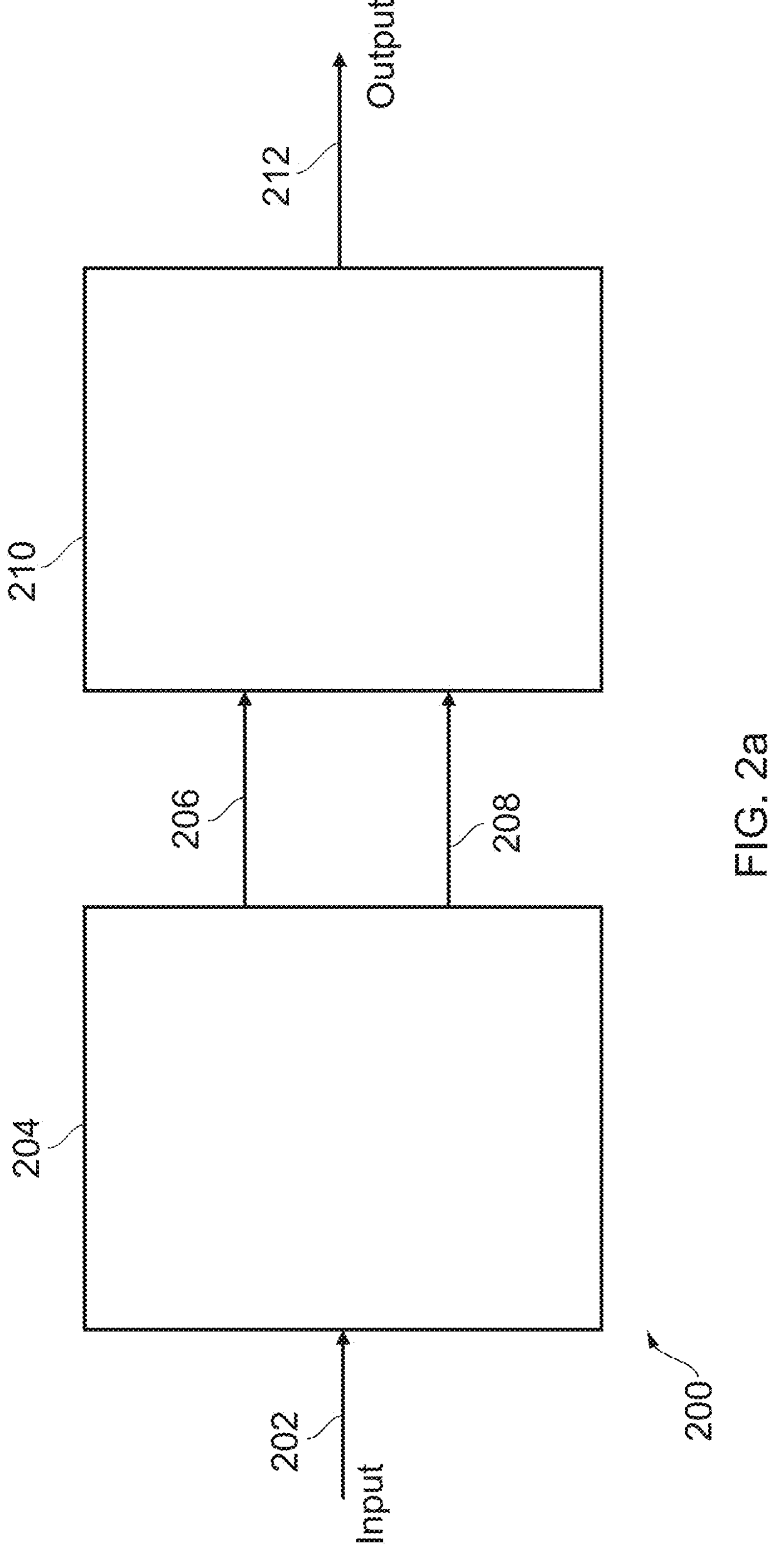
FIG. 2*a* is a schematic diagram of a segmented DAC system.

FIG. 2*a* is a schematic diagram of a DAC system 200. The DAC system 200 receives a digital input signal 202 at a first stage 204. The first stage 204 generates or provides two reference signals V1 206 and V2 208. The second stage 210 receives the reference signals 206, 208 and generates or provides an analog output signal 212.

Figure 2B:
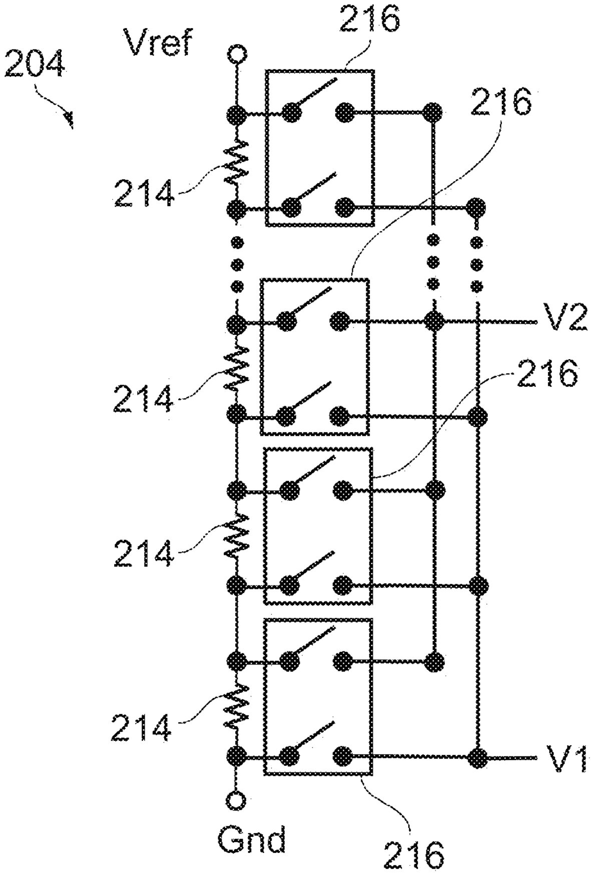
FIG. 2*b* is a schematic diagram of a resistor string forming part of the first stage of the DAC system of FIG. 2*a;*

FIG. 2*b* is a schematic diagram of a first stage 204 of the DAC system 200. The first stage 204 comprises a resistor string or impedance string, which comprises a plurality of resistors or impedances 214 coupled between a reference voltage Vref (for example the power supply voltage Vdd) and ground. Whilst ground is shown in the figure, it should be understood that any other reference voltage may be used in its place. A plurality of switching elements 216 (which may also be referred to as a switching bank) are coupled to the resistors 214.

As described with respect to FIG. 1, the switching elements 216 of the first stage 204 of the DAC are configured to switch in dependence on a number of bits of the digital input 202 so as to output a first voltage V1 and a second voltage V2. The values of the voltages V1 and V2 are dependent on which switches of 216 are closed. Controlling the switches coupled to the resistor string using a number of bits of the digital input results in the voltages V1 and V2 being representative of a number of bits of the digital input word. The second stage 210 of the DAC system 202 DAC may then receive the voltages V1 and V2 and configure the output in dependence on the values of the voltages V1 and V2 and in dependence on a different set of bits of the digital input.

Whilst FIG. 2*b* shows a resistor string, it should be understood that any suitable first stage 202 that generates reference voltages in dependence on a digital input may be used.

As noted with respect to FIG. 1, there is a need to improve the second stage 210 of the DAC system 200 to operate more efficiently, reducing the number of switches whilst maintaining high monotonicity. The following figures and description describe how the second stage 210 may be provided. The second stage 210 will be referred to as a DAC, as it receives a number of bits of the digital input and provides an analog output. The DAC acts to receive a digital input and interpolate between two reference values or voltages (V1 and V2) to provide the analog output. The DAC may also be considered to be a sub-DAC or substage.

Figure 3:
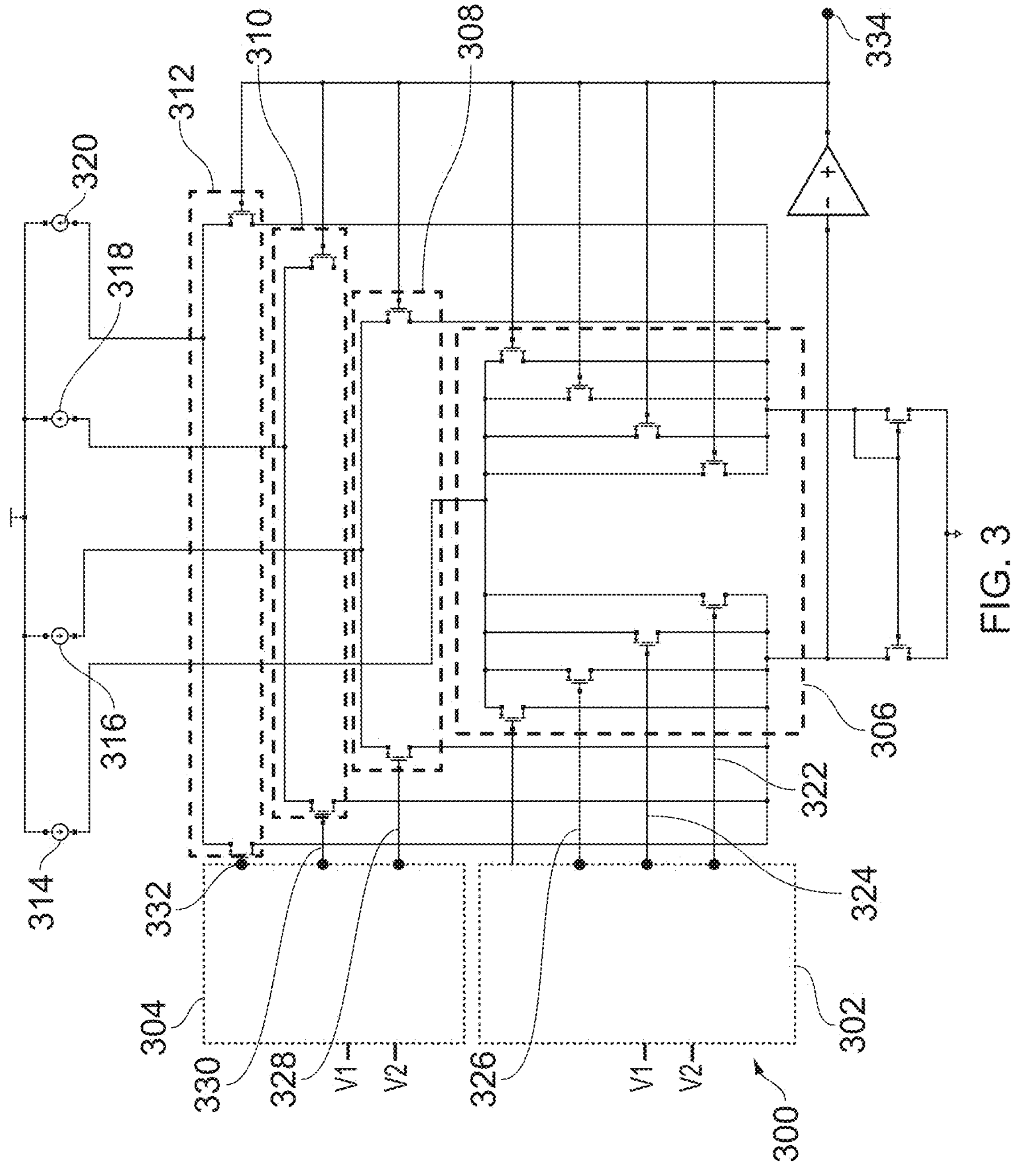
FIG. 3 is a schematic diagram of a four-bit segmented DAC with multiple current sources.

FIG. 3 is a schematic diagram of a DAC 300 including two sections, which may be used as the second stage 210 of the DAC 200, or independently as a separate DAC. The DAC comprises an LSB section 302 configured to receive the least significant bits of a digital input and an MSB section 304 configured to receive the most significant bits of the digital input. The LSB section acts to convert the LSBs of the digital input into a first analog signal and the MSB section acts to convert the MSBs of the digital input into a second analog signal. These respective analog outputs may then be combined to provide the analog output of the DAC. The digital input provided to the DAC 300 may be a whole digital word, or part of a digital word, where the remainder of the digital word is represented by the values of the reference voltages V1 and V2.

The DAC 300 is a four-bit DAC configured to split the digital input into two least significant bits and two most significant bits. However, it should be understood that the DAC may be configured to receive inputs with a different number of bits, such as 8 bits, 16 bits or 32 bits. Similarly, the boundary between the least significant bits and most significant bits may be modified, such that different proportions of the digital input word are considered to be MSBs or LSBs.

The LSB section 302 and the MSB section 304 receive a first reference voltage V1 and a second reference voltage V2 (for example from the first stage 202 of the DAC 200, or any other suitable source such as a resistor string). These reference voltages may be any suitable value. For example, the first reference voltage may be ground or 0 v, and the second reference voltage may be a voltage rail or power supply voltage of the system. Alternatively, the reference voltages may be generated in a first stage 204 of a DAC system 200 based on a number of bits of a digital input 202. Any two different reference voltages may be used.

The LSB section 302 receives the LSBs of the digital input and generates a plurality of output control signals. Similarly, the MSB section 304 receives the MSBs of the digital input and generates a plurality of output control signals. The output control signals may be DC signals and have voltages equal to either the first reference voltage V1 or the second reference voltage V2.

The output control signals are outputted by the LSB section 302 and the MSB section 304 to respective transconductance stages or elements 306, 308, 310, 312. The LSB section 302 provides output control signals to a first or LSB transconductance stage 306. The MSB section 304 provides output control signals to one or more transconductance stages. In the system of FIG. 3, this comprises a first MSB transconductance stage 308, a second MSB transconductance stage 310 and a third MSB transconductance stage 312.

Systems which operate on a larger number of bits may have a different number of MSB transconductance stages. For example, where the digital input comprises X most significant bits, the DAC may comprise $2^X-1$ MSB transconductance stages.

The transconductance stages comprise one or more differential transistor pairs. The sources of the differential pairs in each transconductance stage are coupled to respective current sources, 314-320. Each transconductance stage is coupled to a dedicated current source. The gates of one of the transistors in each differential pair is coupled to a respective output control signal provided by the LSB section 302 or the MSB section 304. When the output control signals provided to the gates of the differential pairs transition from V1 to V2 (or vice versa depending on whether the transistors are N-type or P-type transistors) the current drawn from the respective current source changes and the output voltage of the DAC, generated at output terminal 334, changes. The gates of the second one of the transistors in each differential pair are coupled to an output node or output terminal 334.

These 'transconductance stages' have devices in their linear region of operation by having the two input voltages, V1 & V2, being sufficiently close that the respective current source is only partially steered in favour of one direction (one MOS drain) or the other, and the degree of current steering is substantially proportional to the voltage difference (V1−V2). The transconductance of such a stage can be considered to be the ratio of this proportionality, that is the degree of current steering divided by the voltage difference (V1−V2). This is in contrast to the principle of a conventional current-steering DACs, in which each current source is entirely switched to one output or the other.

The LSB section 302 and LSB transconductance stage 306 act to convert the Y LSBs of the digital input to a first analog signal. The MSB section 304 and one or more MSB transconductance stages 308-312 act to convert the X MSBs of the digital input to a second analog signal. The combination of these analog signals provides the analog output signal of the DAC 300.

The LSB transconductance stage 306 comprises four differential transistor pairs, with the sources of the differential pairs coupled to a first current source 314. The number of differential transistor pairs within the LSB transconductance stage is dependent on the number of LSBs. In the four-bit example of FIG. 3, two bits may be LSBs and two bits may be MSBs. Four differential transistor pairs are provided in the LSB transconductance stage 306. Where there are Y LSBs, $2^Y$ differential pairs may be provided in the LSB transconductance stage. The sources of the differential pairs of the transconductance stage are coupled to the same first current source 314. Each of the differential pairs of the LSB transconductance stage can be independently controlled by a respective output control signal of the LSB section 302.

The LSB transconductance stage 306 of FIG. 3 includes $2^Y$ differential pairs (4 differential pairs) however it should be understood that $2^{Y-1}$ (3 differential pairs) may be used instead in another example.

Figure 4:
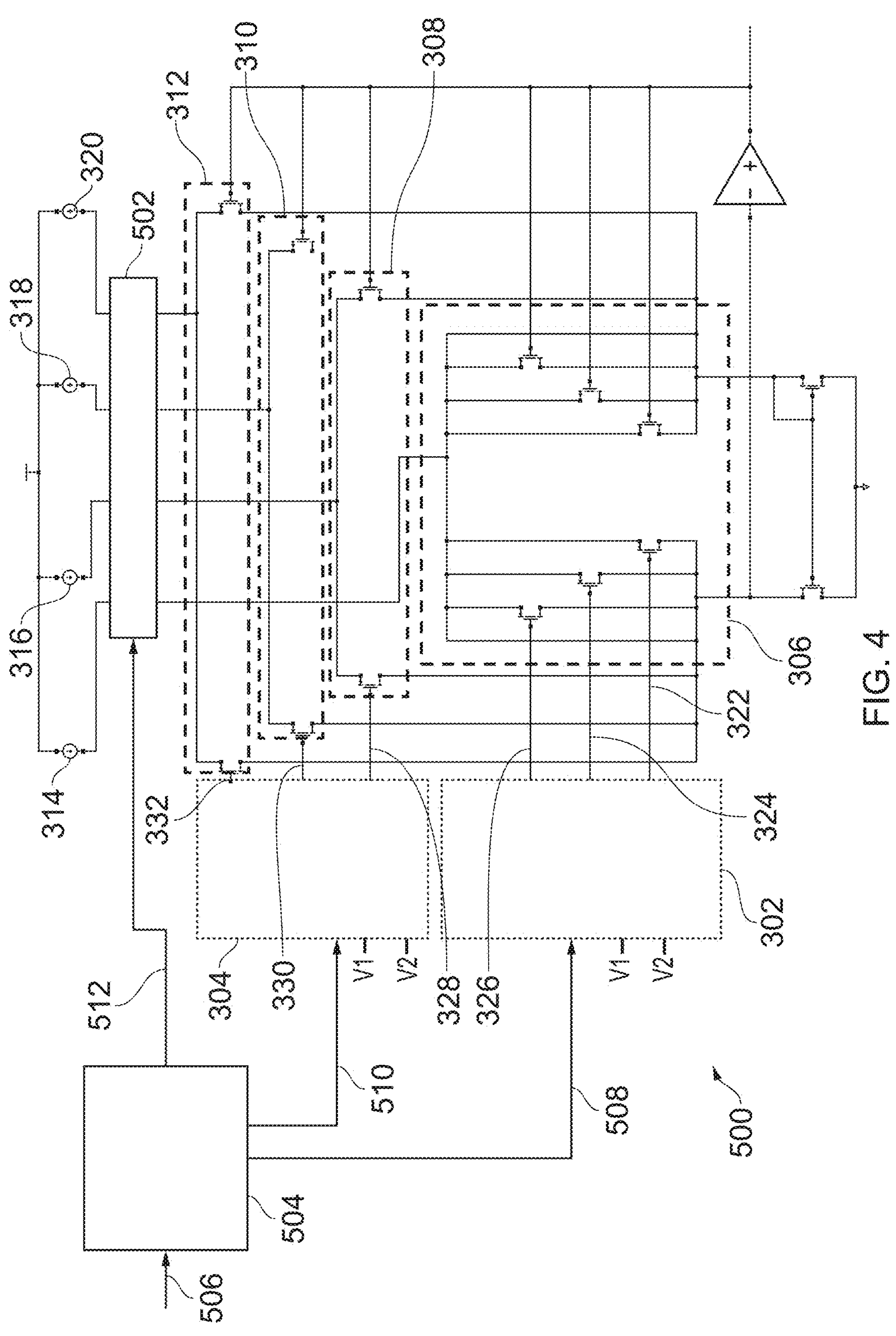
FIG. 4 is a schematic diagram of a four-bit segmented DAC including a switching circuit.

The use of $2^Y$ differential pairs allows the LSB transconductance stage 306 to provide an output resolution in steps of $1/2^Y$ (depending on the number of differential pairs that are switched on). When all switches are on (or connected to reference voltage V2), the output value of the LSB transconductance stage 306 is $2^Y$. When all the differential pairs are off (or connected to reference voltage V1), the output value of the LSB transconductance stage 306 is 0. As such, the value of $2^Y$ may be provided by the LSB transconductance stage 306 or by one of the MSB transconductance stages 308-312. The LSB transconductance stage may instead include $2^Y-1$ differential pairs. The LSB transconductance stage may provide values of 0, 1 . . . $2^Y-1$. Where there are $2^Y-1$ differential pairs (which would be three differential pairs in four-bit DAC, as shown in FIG. 4), the value of zero may be represented by none of the differential pairs being turned on (or all coupled to V1). Using $2^Y-1$ differential pairs reduces the number of differential pairs required in the system. As such, where the DAC 300 is discussed further in this application, only $2^Y-1$ differential pairs are included in the LSB transconductance stage 306.

The MSB transconductance stages 308-312 each comprise a differential transistor pair coupled to a respective current source. The first MSB transconductance stage 308 includes a differential pair with the sources coupled to the second current source 316. The second MSB transconductance stage 310 includes a differential pair with the sources coupled to a third current source 318. The third MSB transconductance stage 312 includes a differential pair with the sources coupled to a fourth current source 320.

Each of the transconductance stages is therefore coupled to a dedicated current source.

Each of the transistors included in the differential pairs of the MSB transconductance stages 308, 310, 312 has a width-to-length (W/L) ratio that is four times the width-to-length ratio of the differential pairs of the LSB transconductance stage 306. In this way, the differential pairs of the MSB transconductance stages have higher transconductance, and allow a greater current to flow for the same gate voltage compared to the differential pairs of the LSB transconductance stage 306. As such, changing one of the output control signals from the MSB section 304 from V1 to V2 has a greater impact on the output of the DAC than changing one of the output control signals from the LSB section 302 from V1 to V2.

In this way, if three of the differential pairs of the LSB transconductance stage 306 are turned on, the output of the DAC 300 is representative of a value of three (where the binary input is 0011). If a single one of the MSB transconductance stages is turned on, the output of the DAC is representative of a value of four (where the binary input is 0100). Any binary input between 0000 and 1111 can be represented by turning on and off differential pairs of the transconductance stages. Where the binary input is 0000, all of the differential pairs receive an output control signal of V1 from the MSB and LSB sections. Where the binary input is 1111, all of the differential pairs receive an output control signal of V2 from the MSB and LSB sections.

Whilst the transistors of the MSB transconductance stages 308, 310, 312 of the example of FIG. 3 have a W/L ratio four times greater than the W/L ratio of the, this ratio may be different depending on the number of bits which are considered LSBs. As such, where the binary input has Y LSBs, the W/L ratio of the differential pairs of the MSB transconductance stages is $2^Y$ times that of the W/L ratio of the differential pairs of the LSB transconductance stage 306. Alternatively, each MSB transconductance stage may comprise a number of differential pairs connected in parallel, with the gates of the parallel differential pairs connected to the same output control signal from the MSB section 304. For example, the differential pair of the first MSB transconductance stage 308 may be replaced with four differential pairs coupled in parallel to the same output control signal of the MSB section 304, each of the differential pairs having the same W/L ratio as the differential pairs of the LSB transconductance stage.

The MSB section 304 and the LSB section 302 of FIG. 3 may a plurality of multiplexers configured to receive control signals dependent on the digital input signal of the DAC 300 and provide output control signals to the transconductance stages in dependence on the value of the digital input. The LSB section and MSB section may be implemented using other circuitry, such as control circuitry or transistors.

When the digital input of the DAC 300 transitions from a value of $2^Y-1$ to a value of $2^Y$, the outputs control signals transition from V2 to V1 for all the differential pairs of the LSB transconductance stage 306, and one output control signal of the MSB section 304 transitions from V1 to V2.

In a four-bit example, with two MSBs and two LSBs, this is a change in the digital input from 0011 to 0100.

The output of the DAC was provided by the LSB transconductance stage 306 and thus dependent on the first current source 314. With the change in the digital input, the output of the DAC 300 transitions to being provided solely by the first MSB transconductance stage 308 and the second current source 316. Ideally, the current sources coupled to the DAC transconductance stages would be the same. However, as in any circuit, there may be an error or variance in the current provided by the current sources. If this error is large enough, and the second current source 316 has a significantly lower value than the first current source 314, then the transition of the digital input from 0011 to 0100 may cause a decrease in the output of the DAC. As such, the DAC may not have a fully monotonic output when the system transitions between the use of the LSB section 302 and the MSB section 304.

In a four-bit example, if the second current source 316 provides a current that is $1/4^{th}$ lower than the first current source 314, the output will not increase when the LSB transconductance stage 306 is turned off and the first MSB transconductance stage 308 is turned on. This results in a non-monotonic output In DACs with a larger number of LSBs, a smaller percentage variance between the current sources causes a non-monotonic change in the output. For example, where there are four LSBs, a $1/16^{th}$ variance in the current provided by the current sources can provide a non-monotonic change in the output.

The DAC of FIG. 3 allows the use of less switches when compared to the DAC of FIG. 1, as each of the MSB transconductance stages requires a single differential pair to represent a $2^Y$ increase in the digital input. However, the LSB section is not thermometric. Due to the segmentation of the DAC, the DAC is no longer inherently monotonic. This lack of monotonicity is particularly pronounced at every $2^Y-1$ to $2^Y$ transition in the input code of the DAC, when all the differential pairs of the LSB transconductance stage switch at the same time as one of the MSB transconductance stages switching.

It is desirable to provide a DAC with a reduced number of switches, as in the DAC 300, whilst improving the monotonicity of the output.

FIG. 4 is a schematic diagram of a DAC system 500. The DAC system includes a number of features described with respect to FIG. 3 and as such these features will not be described again. The DAC 500 includes a switching circuit 502 coupled between the plurality of current sources 314-320 and the transconductance stages 306-312 of the DAC 500. As noted previously, the LSB transconductance stage 306 of FIG. 4 includes three differential pairs, however four differential pairs could be used instead (as shown in FIG. 3).

The switching circuit 502 is configured to switchably connect each of the current sources 314-320 to a respective transconductance stage of the plurality of transconductance stages 306-312.

The switching circuit 502 may comprise any suitable switching circuitry, such as a plurality of switches, a plurality of switching elements or one or more multiplexers. The switches or switching elements may comprise one or more transistors, such MOSFETs. However, other suitable transistor types may be used.

The DAC 500 comprises a control system 504. The control system 504 is configured to receive a digital input 506 for conversion by the DAC 500. The control system generates one or more LSB section control signals 508 and one or more MSB section control signals 510. The LSB 508 and MSB 510 section control signals control the operation of the LSB and MSB sections in dependence on the digital input 506. As such, the output control signals 322-332 of the LSB and MSB sections are controlled by the LSB control signal 508 and the MSB control signal 510.

The control system 504 is further configured to generate a switching circuit control signal 512. The switching circuit control signal 512 controls the configuration of the plurality of switching elements within the switching circuit 502. As such, the switching control signal 512 may configure the switching circuit 502 to couple or decouple the current sources 314-320 of the DAC 500 to or from respective LSB 306 or MSB 308-312 transconductance stages.

The control system 504 shown in FIG. 4 is a separate element, however the control system may be integrated with one or more of the LSB section 302 and the MSB section 304.

The control system 504 may comprise one or more processors and a memory. The processor may be configured to read from the memory. Alternatively, the control system may comprise logic circuits or other control means.

Figure 5:
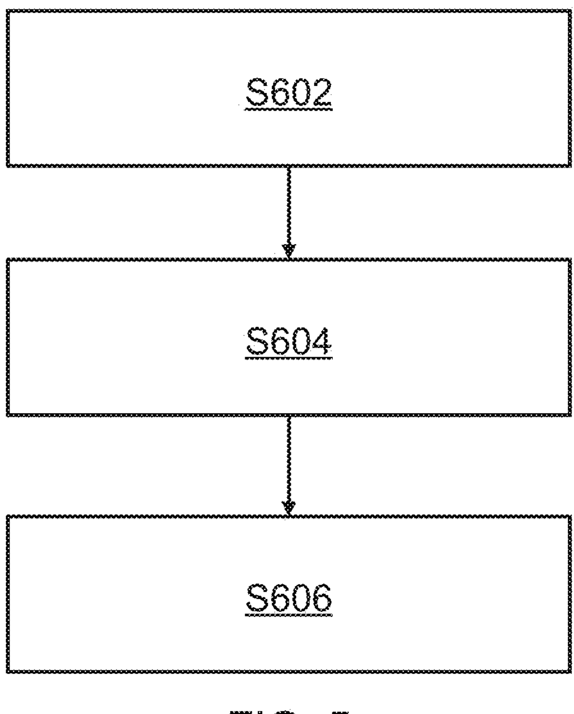
FIG. 5 is a flowchart of a method for controlling a DAC.

FIG. 5 is flowchart of a method for controlling the DAC 500. The method may be performed by the control system 504 of the DAC 500, or the control system of any suitable DAC.

Step S602 comprises receiving a digital input comprising a plurality of bits. The digital input includes a first segment comprising X most significant bits, MSBs, and a second segment comprising Y least significant bits, LSBs. The number of bits that are considered to be MSBs and LSBs may be determined at manufacture of the device. Any number of MSBs or LSBs may be used. Typically, the digital input may comprise 4, 8, 16, 32, 64, or 128 bits. Half of the bits of the digital input may be MSBs and half LSBs, however, any proportion of the bits of the digital input may be LSBs, such as 25%, 50%, 75%.

The digital input may change over time. Step S506 comprises detecting a change in the value of the digital input compared to a previous value of the digital input. Where the digital input changes such that the value of the MSBs change, and the LSBs change by a value of $2^Y-1$, an error may occur. As described previously, where the value of the LSBs change from $2^Y-1$ to 0 and the value of the MSBs increase by $2^Y$, then the output of the DAC transitions from being provided by (at least partly) the LSB transconductance stage 306 to being provided by one or more of the MSB transconductance stages 308-312.

Step S606 comprises modifying the couplings between the current sources 314-320 and the transconductance stages 306-312. Modifying the coupling comprises decoupling current sources from respective transconductance stages and coupling the decoupled current sources to alternative transconductance stages. Step S606 comprises decoupling the first current source 314 from the LSB transconductance stage 306 and coupling the first current source 314 to the first MSB transconductance stage 308.

Modifying the coupling of the first current source 314 in this way ensures that the same current source error that was provided to the LSB transconductance stage 306 is provided to the first MSB transconductance stage 308 when the digital input changes in such a way that the output is provided by the MSB transconductance stage 308 and not by the LSB transconductance stage 306. This ensures that the transition between the transconductance stages maintains a monotonic output, as the same current source error is present in the output. If the current sources were not changed, then current source variance may result in the output decreasing even when the DAC 500 input increases.

Figure 6A:
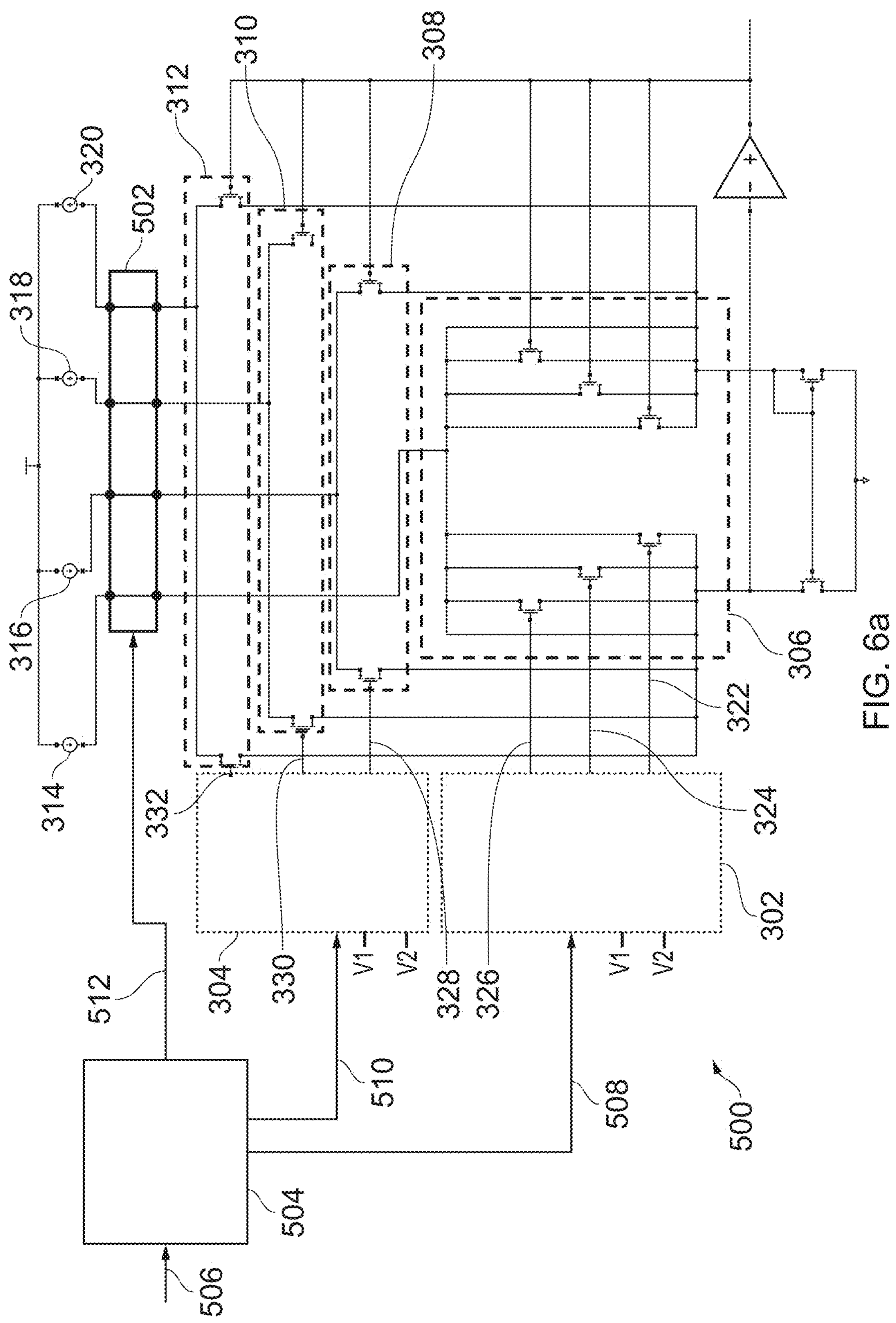
FIG. 6*a* is a schematic diagram of a four-bit segmented DAC including a switching circuit coupling current sources in a first position.

FIG. 6a shows a first configuration of the DAC 500, with the connections provided by the switching circuit 502 presented for ease. Whilst these connections are shown as simple direct connections, this is for ease of understanding only. Instead, the connections may be provided by one or more switches or switching elements within the switching circuit.

The first current source 314 is coupled to the LSB transconductance stage 306. The second current source 316 is coupled to the first MSB transconductance stage 308. The third current source 318 is coupled to the second MSB transconductance stage 310. The fourth current source 320 is coupled to the third MSB transconductance stage 312.

With a four-bit input, including two LSBs and two MSBs, the digital input may be 0011. As such, output control signals 322-326 may have a value of V2. Output control signals 328-332 may have a value of V1.

If the digital input changes to 0100, output control signals 322-326 and 330-332 have a value of V1. Output control signal 328 has a value of V2.

Figure 6B:
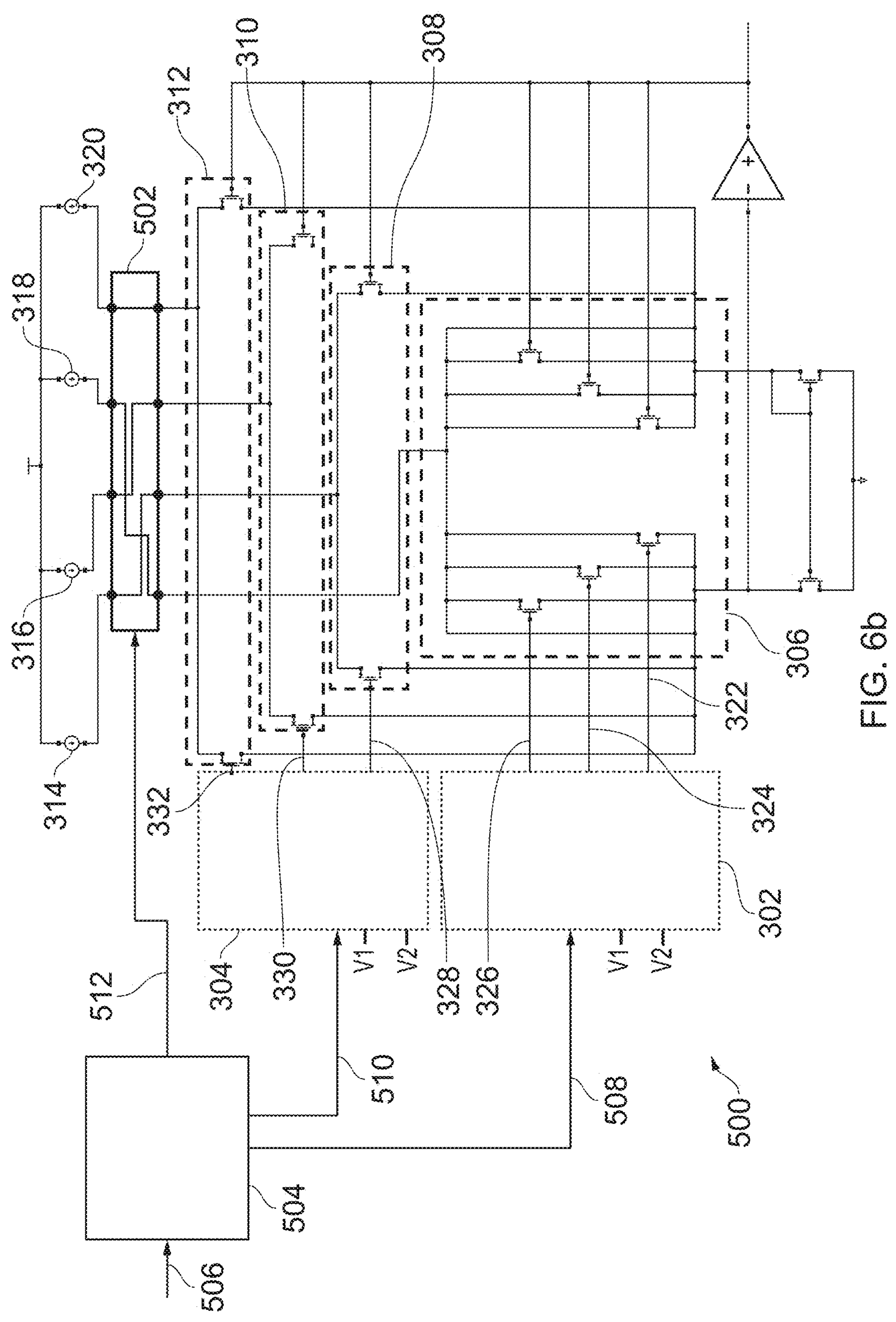
FIG. 6*b* is a schematic diagram of a four-bit segmented DAC including a switching circuit coupling current sources in a second position.

FIG. 6b shows a second configuration of the DAC 400.

To ensure the same error is present in the output, the first current source 314 is decoupled from the LSB transconductance stage 306 and is coupled to the first MSB transconductance stage 308.

To ensure that all the transconductance stages are coupled to a current source, the second current source 316 is decoupled from the first MSB transconductance stage 308 and is coupled to the second MSB transconductance stage 310. The third current source 318 is decoupled from the second MSB transconductance stage 310 and is coupled to the LSB transconductance stage 306.

The DAC 400 input may change from 0100 to 0111. No change is required in the coupling of the current sources to provide this transition, as it does not require the switching of an MSB transconductance stage. As such, the switching circuit 402 may continue to couple the same current sources and transconductance stages as shown in FIG. 6b.

If the digital input transitions from 0111 to 1000, a similar error may be present. The output control signals 322-326 and 332 have a value of V1. Output control signals 328 and 330 have a value of V2. As such, the analog output is provided by two of the MSB transconductance stages, with the second MSB transconductance stage 310 turning on, and the LSB transconductance stage 306 turning off.

Figure 6C:
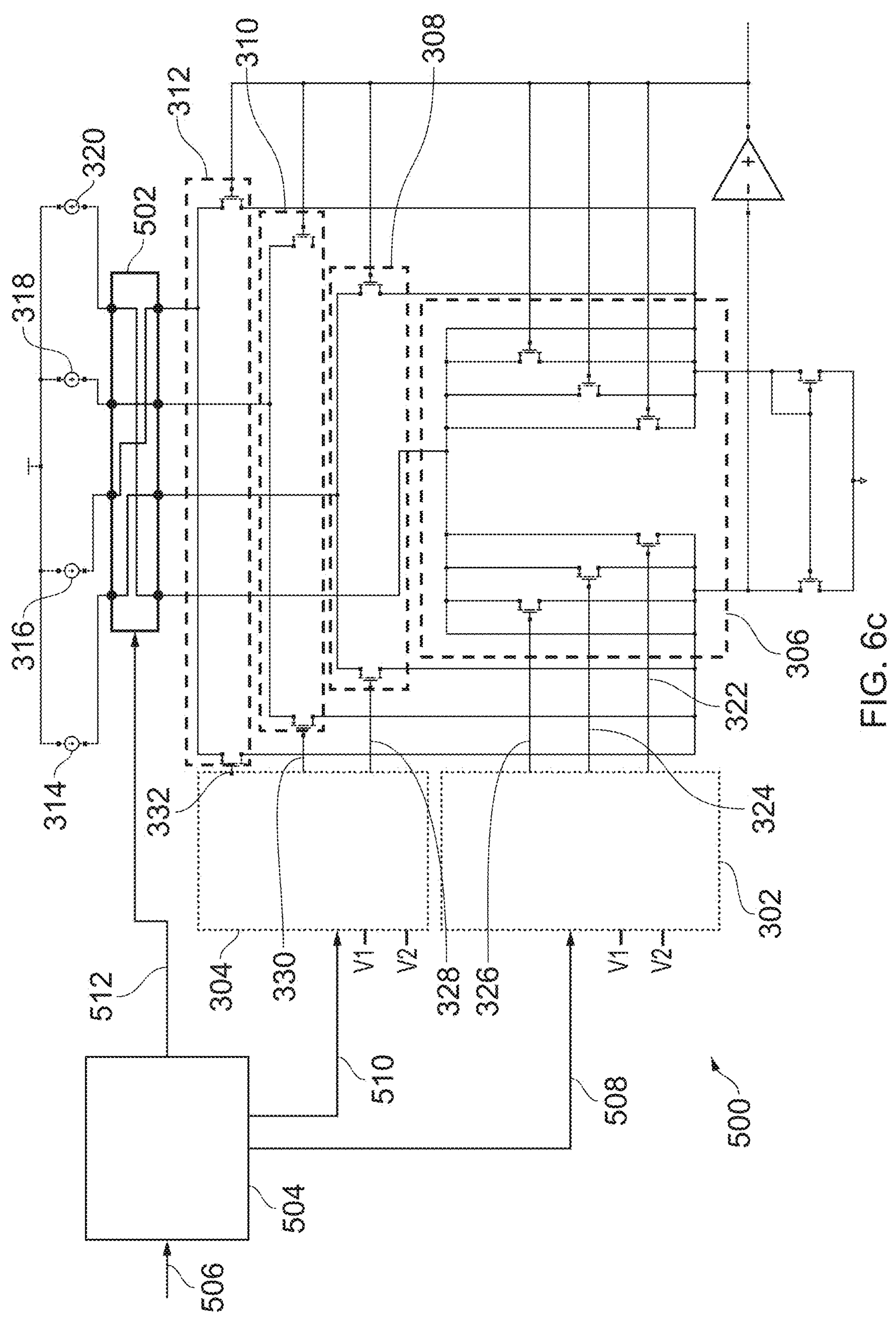
FIG. 6*c* is a schematic diagram of a four-bit segmented DAC including a switching circuit coupling current sources in a third position.

FIG. 6*c* shows a third configuration of the DAC 400.

As such, the third current source 318 is decoupled from the LSB transconductance stage 306 and is coupled to the second MSB transconductance stage 310. The first current source 314 remains coupled to the first MSB transconductance stage 308. The second current source 318 is decoupled from the second MSB transconductance stage 310 and is coupled to the third MSB transconductance stage 312. The fourth current source 320 is decoupled from the third MSB transconductance stage 312 and is coupled to the LSB transconductance stage 306.

As the value of the digital input increases, different current sources will be coupled to the LSB transconductance stage 306. Each time there is a transition in the digital input such that the LSBs decrease in value by a maximum possible amount (i.e. all ones to all zeros, or a change of $2^Y-1$) the current source coupled to the LSB transconductance stage will be coupled to an MSB transconductance stage which sees a transition in its control signal and turns on.

Whilst the possible error has been discussed with respect to a decrease in the value of the LSBs and an increase in the value of the MSBs, an error may also occur where there is a one bit decrease in the digital input. Where there is a decrease in the value of the MSBs by more than $2^Y$ and a change in the value of the LSBs from 0 to $2^Y-1$, the error may occur. For example, where there are two MSBs and two LSBs in a four bit digital input and the digital input changes from 1100 to 1011, an MSB transconductance is turned off, and all of the differential pairs of the LSB transconductance stage are turned on.

As such, a current source is decoupled from the MSB transconductance stage that is turned off and is coupled to the LSB transconductance stage.

Switching the current sources in the described manner offers a significant improvement in the differential non-linearity (DNL) of the DAC. A small number of additional switching elements are required to provide this improvement and limited additional logic circuitry. The logic or control circuitry used to operate the MSB and LSB sections can be reconfigured to also provide control of the switching circuit 502, as the switching circuit transitions at the same time as the output control signals of the MSB and LSB sections transition.

To reduce integral non-linearity (INL) of the DAC 400, the transconductance of the transconductance stages my be reduced. However, this increases the noise in the analog output and alters the offset of the DAC. With the segmented DAC presented in FIG. 4, the linearity is determined by the LSB section.

To improve the INL of the system, the differential pairs of the LSB transconductance stage 306 may be degenerated.

Figure 7:
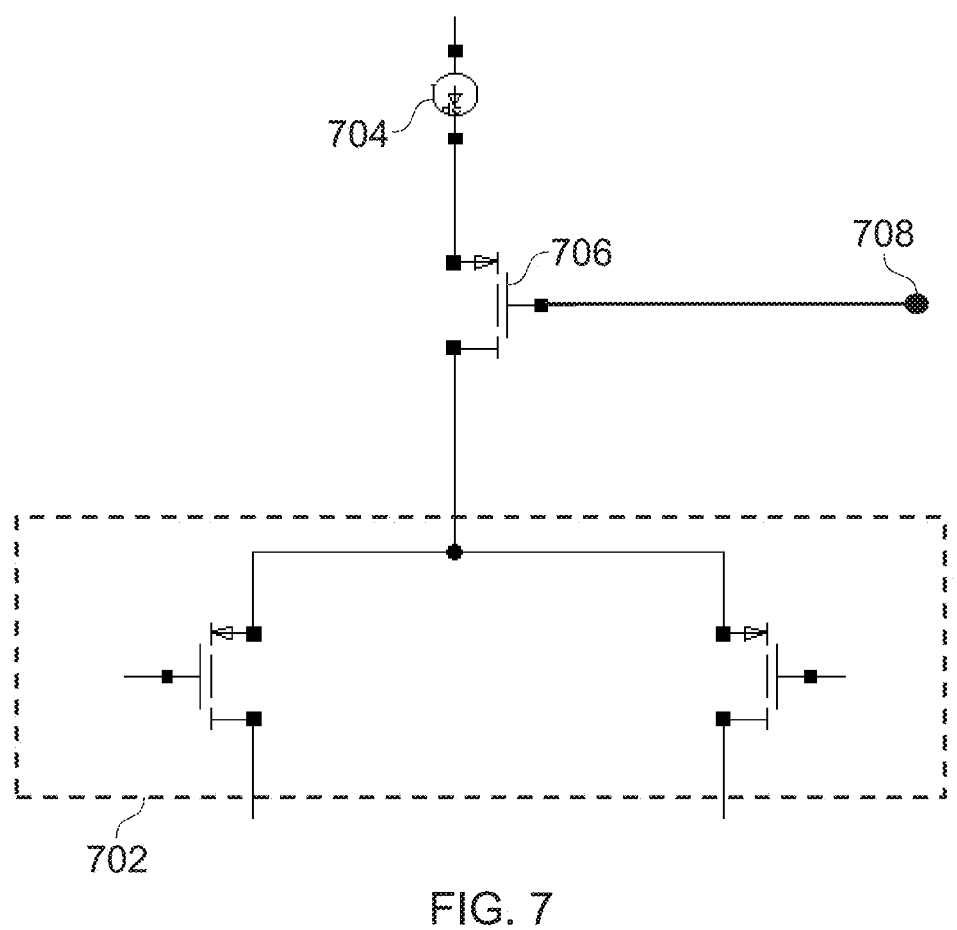
FIG. 7 is a schematic diagram of a degeneration transistor coupled between a current source and a differential pair.

FIG. 7 shows a first differential pair of transistors 702. The differential pair 702 may represent one of the differential pairs of the LSB transconductance stage 306. As described previously, a current source 704 is coupled to the LSB transconductance stage, and in particular to the sources of the transistors of the differential pairs 702 of the LSB transconductance stage 306. The switching circuit 502 and the remaining transconductance stages and differential pairs of the DAC 400 are not shown in FIG. 7 for simplicity, however it should be understood that the differential pair and circuitry of FIG. 7 could be included in the DAC 400 of FIG. 4.

A degeneration transistor 706 is coupled between the current source 704 and the differential pair 702. The switching circuit 502 would be coupled between the current source 704 and the degeneration transistor 706.

The gate of the degeneration transistor 706 is coupled to the output 334 of the DAC. The degeneration transistor 706 is specified to have a width to length ratio that is smaller than that of the differential pairs 702 of the LSB transconductance stage. The W/L ratio of the degeneration transistor 706 may be substantially smaller than the W/L ratio of the differential pairs of the LSB transconductance stage 306. For example, the W/L ratio of the degeneration transistor 706 may be 1/4, 1/8, 1/16, 1/32, 1/64, etc. of the W/L ratio of the differential pairs of the LSB transconductance stage 306. The degeneration transistor 706 may be a MOSFET held in the linear region of operation.

The degeneration transistor 706 is shown coupled to one differential pair of the LSB transconductance stage 306, however the degeneration transistor may be coupled to all of the differential pairs of the LSB transconductance stage 306.

Including the degeneration transistor significantly improve the INL of the DAC 300. Due to the structure of the DAC, the degeneration only has to be applied to the LSB transconductance stage 306. As the LSB transconductance stage 306 has the greatest impact on DAC linearity.

Whilst a single degeneration transistor may be used, alternatively a respective cascode transistor may instead be coupled between the switching circuit 502 and each of the differential pairs of the LSB transconductance stage 306. The cascode transistors ensure that the current from the current source coupled to the LSB transconductance stage 306 is split equally among each of the differential pairs of the LSB transconductance stage 306.

Various modifications whether by way of addition, deletion, or substitution of features may be made to the above described examples to provide further examples, any and all of which are intended to be encompassed by the appended claims.

ASPECTS OF THE INVENTION

Included below are a set of numbered aspects according to the disclosure:

1. A method for controlling a digital-to-analog converter, DAC, the method comprising:
   - receiving a digital input comprising a plurality of bits including a first segment comprising X most significant bits, MSBs, and a second segment comprising Y least significant bits, LSBs;
   - detecting a change in the value of the MSBs and detecting a change in the value of the LSBs by $2^Y-1$;
   - decoupling a first current source from a least-significant bit, LSB, transconductance stage of the DAC; and
   - coupling the first current source to a first most-significant bit, MSB, transconductance stage of the DAC.
2. The method according to aspect 1, further comprising:
   - decoupling a second current source from the first MSB transconductance stage of the DAC;
   - coupling the second current source to a second MSB transconductance stage of the DAC.
3. The method according to aspect 1 or aspect 2, further comprising:
   - decoupling a third current source from the second MSB transconductance stage of the DAC; and coupling the third current source to the LSB transconductance stage of the DAC.

4. The method according to aspect 1, further comprising:

decoupling a second current source from the first MSB transconductance stage of the DAC;

coupling the second current source to the LSB transconductance stage of the DAC.

5. The method according to any preceding aspect, wherein detecting a change in the value of the MSBs and a change in the value of the LSBs by $2^Y-1$ comprises:

detecting an increase in the value of the MSBs by $2^Y$ or more and a change in the value of the LSBs from $2^Y-1$ to 0.

6. The method according to any of aspects 1-4, wherein detecting a change in the value of the MSBs and a change in the value of the LSBs by $2^Y$ comprises:

detecting a decrease in the value of the MSBs by $2^Y$ or more and a change in the value of the LSBs from 0 to $2^Y-1$.

7. The method according to any preceding aspect, further comprising:

converting, using the LSB transconductance stage, the Y LSBs to a first analog signal;

converting, using the MSB transconductance stages, the X MSBs to a second analog signal.

8. The method according to aspect 7, further comprising:

combining the first analog signal and the second analog signal to provide an analog output signal.

9. The method according to aspect 7 or aspect 8, wherein:

the LSB transconductance stage comprises one or more differential pairs, and wherein converting, using the LSB transconductance stage, the Y LSBs to a first analog signal comprises modifying one or more control signals supplied to the one or more differential pairs of the LSB transconductance stage;

the MSB transconductance stages comprise each comprise a differential pair, and wherein converting, using the MSB transconductance stages, the X MSBs to a second analog signal comprises modifying one or more control signals supplied to differential pairs of the MSB transconductance stages.

10. A digital-to-analog converter, DAC, circuit comprising:

an input for receiving a digital input comprising a plurality of bits including a first segment comprising X most significant bits, MSBs, and a second segment comprising Y least significant bits, LSBs;

an LSB transconductance stage;

one or more MSB transconductance stages comprising a first transconductance stage;

a first current source;

a switching circuit, the switching circuit coupled between the first current source and the LSB transconductance stage and the one or more MSB transconductance stages, wherein, when the value of the MSBs change and the value of the LSBs change by $2^Y-1$, the switching circuit is configured to:

decouple the first current source from the LSB transconductance stage and couple the first current source to the first MSB transconductance stage.

11. The DAC circuit according to aspect 10, further comprising a second current source;

wherein the one or more MSB transconductance stages comprise a second MSB transconductance stage, and wherein the switching circuit is coupled between the second current source, the LSB transconductance stage and the one or more MSB transconductance stages, wherein, when the value of the MSBs change and the value of the LSBs change by $2^Y-1$, the switching circuit is configured to:

decouple the second current source from the first MSB transconductance stage and couple the second current source to the second MSB transconductance stage.

12. The DAC circuit according to aspect 10 or aspect 11, further comprising a third current source;

wherein the switching circuit is coupled between the third current source, the LSB transconductance stage and the one or more MSB transconductance stages, wherein, when the value of the MSBs change and the value of the LSBs change by $2^Y-1$, the switching circuit is configured to:

decouple the third current source from the second MSB transconductance stage and couple the second current source to the LSB transconductance stage.

13. The DAC circuit according to aspect 10, further comprising a second current source;

wherein the one or more MSB transconductance stages comprise a second MSB transconductance stage, and wherein the switching circuit is coupled between the second current source, the LSB transconductance stage and the one or more MSB transconductance stages, wherein, when the value of the MSBs change and the value of the LSBs change by $2^Y-1$, the switching circuit is configured to:

decouple the second current source from the first MSB transconductance stage and couple the second current source to the LSB transconductance stage of the DAC.

14. The DAC circuit according to any of aspects 10-13, wherein the LSB transconductance stage comprises:

$2^Y$ LSB differential pairs, each LSB differential pair comprising a first transistor and a second transistor, wherein a source of the first transistor and a source of the second transistor of the LSB differential pairs are coupled to each other and to the switching circuit.

15. The DAC circuit according to any of aspects 10-13, wherein the LSB transconductance stage comprises:

$2^Y-1$ LSB differential pairs, each LSB differential pair comprising a first transistor and a second transistor, wherein a source of the first transistor and a source of the second transistor of the LSB differential pairs are coupled to each other and to the switching circuit.

16. The DAC circuit according to any of aspects 14 or 15, wherein each of the one or more MSB transconductance stages comprises:

an MSB differential pair, the MSB differential pair having a width-to-length ratio that is $2^Y$ times greater than a width-to-length of the LSB differential pairs.

17. The DAC circuit according to any of aspects 14-16, wherein the LSB transconductance stage further comprises:

a degeneration transistor biased in the linear region, the degeneration transistor coupled between the switching circuit and the sources of the LSB differential pairs, wherein the degeneration transistor has a width to length ratio that is less than a width to length ratio of the LSB differential pairs.

18. The DAC circuit according to any of aspect 14-16, wherein the LSB transconductance stage further comprises:

a plurality of cascode transistors, each cascode transistor coupled between the switching circuit and the sources of a respective differential pair of the LSB differential pairs.

19. A method for controlling a digital-to-analog converter, DAC, the method comprising:

receiving a digital input;

detecting a change in the value of the most significant bits, MSBs, of the digital input and detecting a change in the value of the least significant bits, LSBs, of the digital input by $2^Y-1$;

decoupling a first current source from a first transconductance stage of the DAC; and coupling the first current source to a second transconductance stage of the decoder.

20. The method according to aspect 19, further comprising:

decoupling a second current source from the second transconductance stage of the decoder;

coupling the second current source to a third transconductance stage of the decoder.

The invention claimed is:

1. A method for controlling a digital-to-analog converter (DAC), the method comprising:

receiving a digital input comprising a plurality of bits including a first segment comprising X most significant bits (MSBs) and a second segment comprising Y least significant bits (LSBs);

detecting a change in value of the digital input comprising a change in value of the MSBs and a change in value of the LSBs by $2^Y-1$; and in response to the detecting;

decoupling a first current source from a least-significant bit (LSB) transconductance stage of the DAC; and coupling the first current source to a first most-significant bit (MSB) transconductance stage of the DAC.

2. The method according to claim 1, further comprising:

decoupling a second current source from the first MSB transconductance stage of the DAC; and coupling the second current source to a second MSB transconductance stage of the DAC.

3. The method according to claim 2, further comprising:

decoupling a third current source from the second MSB transconductance stage of the DAC; and coupling the third current source to the LSB transconductance stage of the DAC.

4. The method according to claim 1, further comprising:

decoupling a second current source from the first MSB transconductance stage of the DAC; and coupling the second current source to the LSB transconductance stage of the DAC.

5. The method according to claim 1, wherein the detecting the change in the value of the MSBs and the change in the value of the LSBs by $2^Y-1$ comprises:

detecting an increase in the value of the MSBs by $2^Y$ or more and a change in the value of the LSBs from $2^Y-1$ to 0.

6. The method according to claim 1, wherein the detecting the change in the value of the MSBs and the change in the value of the LSBs by $2^Y-1$ comprises:

detecting a decrease in the value of the MSBs by $2^Y$ or more and a change in the value of the LSBs from 0 to $2^Y-1$.

7. The method according to claim 1, further comprising:

converting, using the LSB transconductance stage, the Y LSBs to a first analog signal; and converting, using MSB transconductance stages that comprise the first MSB transconductance stage, the X MSBs to a second analog signal.

8. The method according to claim 7, further comprising:

combining the first analog signal and the second analog signal to provide an analog output signal.

9. The method according to claim 7, wherein:

the LSB transconductance stage comprises one or more differential pairs, and wherein converting, using the LSB transconductance stage, the Y LSBs to a first analog signal comprises modifying one or more control signals supplied to the one or more differential pairs of the LSB transconductance stage; and the MSB transconductance stages comprise each comprise a differential pair, and wherein converting, using the MSB transconductance stages, the X MSBs to a second analog signal comprises modifying one or more control signals supplied to differential pairs of the MSB transconductance stages.

10. A digital-to-analog converter (DAC) circuit comprising:

an input for receiving a digital input comprising a plurality of bits including a first segment comprising X most significant bits (MSBs) and a second segment comprising Y least significant bits (LSBs);

an LSB transconductance stage;

one or more MSB transconductance stages comprising a first MSB transconductance stage;

a first current source; and a switching circuit, the switching circuit coupled between the first current source and the LSB transconductance stage and the one or more MSB transconductance stages, wherein, when a value of the MSBs changes and a value of the LSBs changes by $2^Y-1$, the switching circuit is configured to:

decouple the first current source from the LSB transconductance stage and couple the first current source to the first MSB transconductance stage.

11. The DAC circuit according to claim 10, further comprising:

a second current source;

wherein the one or more MSB transconductance stages comprise a second MSB transconductance stage, and wherein the switching circuit is coupled between the second current source, the LSB transconductance stage and the one or more MSB transconductance stages, wherein, when the value of the MSBs changes and the value of the LSBs changes by $2^Y-1$, the switching circuit is configured to:

decouple the second current source from the first MSB transconductance stage and couple the second current source to the second MSB transconductance stage.

12. The DAC circuit according to claim 11, further comprising:

a third current source;

wherein the switching circuit is coupled between the third current source, the LSB transconductance stage and the one or more MSB transconductance stages, wherein, when the value of the MSBs changes and the value of the LSBs changes by $2^Y-1$, the switching circuit is configured to:

decouple the third current source from the second MSB transconductance stage and couple the second current source to the LSB transconductance stage.

13. The DAC circuit according to claim 10, further comprising:

a second current source;

wherein the one or more MSB transconductance stages comprise a second MSB transconductance stage, and wherein the switching circuit is coupled between the second current source, the LSB transconductance stage and the one or more MSB transconductance stages, wherein, when the value of the MSBs changes and the values of the LSBs change by $2^Y-1$, the switching circuit is configured to:

decouple the second current source from the first MSB transconductance stage and couple the second current source to the LSB transconductance stage of the DAC.

14. The DAC circuit according to claim 10, wherein the LSB transconductance stage comprises:

$2^Y$ LSB differential pairs, each LSB differential pair comprising a first transistor and a second transistor, wherein a source of the first transistor and a source of the second transistor of the LSB differential pairs are coupled to each other and to the switching circuit.

15. The DAC circuit according to claim 10, wherein the LSB transconductance stage comprises:

$2^Y-1$ LSB differential pairs, each LSB differential pair comprising a first transistor and a second transistor, wherein a source of the first transistor and a source of the second transistor of the LSB differential pairs are coupled to each other and to the switching circuit.

16. The DAC circuit according to claim 14, wherein each of the one or more MSB transconductance stages comprises:

an MSB differential pair, the MSB differential pair having a width-to-length ratio that is $2^Y$ times greater than a width-to-length of the LSB differential pairs.

17. The DAC circuit according to claim 14, wherein the LSB transconductance stage further comprises:

a degeneration transistor biased in a linear region, the degeneration transistor coupled between the switching circuit and the sources of the LSB differential pairs, wherein the degeneration transistor has a width to length ratio that is less than a width to length ratio of the LSB differential pairs.

18. The DAC circuit according to claim 14, wherein the LSB transconductance stage further comprises:

a plurality of cascode transistors, each cascode transistor coupled between the switching circuit and the sources of a respective differential pair of the LSB differential pairs.

19. A method for controlling a digital-to-analog converter (DAC), the method comprising:

receiving a digital input;

detecting a change in value of the digital input comprising a change in value of most significant bits (MSBs) of the digital input and a change in value of least significant bits (LSBs) of the digital input by $2^Y-1$; and in response to the detecting, decoupling a first current source from a first transconductance stage of the DAC; and coupling the first current source to a second transconductance stage of the DAC.

20. The method according to claim 19, further comprising:

decoupling a second current source from the second transconductance stage of the DAC; and coupling the second current source to a third transconductance stage of the DAC.

* * * * *